United States Patent
Wajima et al.

(10) Patent No.: US 6,747,392 B1
(45) Date of Patent: Jun. 8, 2004

(54) CHIP ELECTRONIC COMPONENTS AND MOUNTING STRUCTURE FOR THE SAME

(75) Inventors: Masaya Wajima, Shinminato (JP); Naoshi Bamoto, Toyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/656,106

(22) Filed: Sep. 6, 2000

(30) Foreign Application Priority Data

Sep. 27, 1999 (JP) .......................................... 11-273144

(51) Int. Cl.[7] .......................... H01L 41/04; H01L 41/08; H01L 41/18; H01L 2/00
(52) U.S. Cl. ........................ 310/320; 310/344; 310/321; 310/366
(58) Field of Search ................................ 310/344, 320, 310/348, 321, 366

(56) References Cited

U.S. PATENT DOCUMENTS

| | | | |
|---|---|---|---|
| 5,410,789 A | * 5/1995 | Noto et al. | 29/25.35 |
| 5,414,917 A | * 5/1995 | Tanaka | 29/25.35 |
| 5,627,425 A | * 5/1997 | Kaida et al. | 310/321 |
| 5,684,436 A | * 11/1997 | Kaida | 333/189 |
| 5,844,348 A | * 12/1998 | Gamo | 310/340 |
| 5,892,415 A | * 4/1999 | Okamura | 333/175 |
| 5,894,401 A | * 4/1999 | Asakura et al. | 361/303 |
| 5,939,819 A | * 8/1999 | Unami et al. | 310/366 |
| 6,011,451 A | * 1/2000 | Gamo | 310/349 |
| 6,064,282 A | * 5/2000 | Futakuchi et al. | 310/340 |
| 6,133,673 A | * 10/2000 | Kawara et al. | 310/320 |
| 6,134,762 A | * 10/2000 | Gamo | 29/25.35 |
| 6,188,163 B1 | * 2/2001 | Danov | 310/316.01 |
| 6,192,562 B1 | * 2/2001 | Okeshi et al. | 29/25.35 |
| 6,215,229 B1 | * 4/2001 | Kuroda et al. | 310/320 |
| 6,232,699 B1 | * 5/2001 | Wajima | 310/320 |
| 6,373,169 B1 | * 4/2002 | Wajima | 310/320 |
| 6,377,135 B1 | * 4/2002 | Kanai et al. | 333/187 |

FOREIGN PATENT DOCUMENTS

| | | |
|---|---|---|
| DE | 198 14 688 A1 | 10/1998 |
| DE | 19854912 A1 * | 7/1999 |
| JP | 3-258107 | 11/1991 |
| JP | 3-277008 | 12/1991 |
| JP | 5-83074 | 4/1993 |
| JP | 5-235682 | 9/1993 |
| JP | 6-224681 | 8/1994 |
| JP | 406224681 A * | 8/1994 |
| JP | 7-41211 | 9/1995 |
| JP | 11-168344 | 6/1999 |

* cited by examiner

Primary Examiner—Burton S. Mullins
Assistant Examiner—Julio C. Gonzalez R.
(74) Attorney, Agent, or Firm—Keating & Bennett, LLP

(57) ABSTRACT

A chip electronic component capable of being mounted with high density while preventing separation of bonded portions caused by solder fillets without requiring a case member having a complicated structure is provided at a low cost. The chip electronic component includes an electronic component element board including a circuit that defines an electronic component therein and having a pair of side surfaces and a lower surface, and a plurality of external electrodes extending over at least one of the side surface and the lower surface of the electronic component element and being electrically connected to the circuit provided therein. The electrode portion provided on the lower surface of the monolithic body as an electronic component element of each external electrode is provided with narrow portions and wide portions provided thereon, and the narrow portion continues to the external electrode portion provided on the side surface thereof.

20 Claims, 12 Drawing Sheets

CHIP ELECTRONIC COMPONENTS AND MOUNTING STRUCTURE FOR THE SAME

BACKGROUND OF THE INVENTION

1. Field of the Invention

The present invention relates to a chip electronic component and a mounting structure therefor, for use with a piezoelectric resonator or a piezoelectric filter and, more particularly, the present invention relates to a chip electronic component and a mounting structure therefor with improved external electrodes provided on the outer surface of an electronic component element.

2. Description of the Related Art

Conventionally, various chip electronic components are used to achieve high-density mounting.

An example of the related art is disclosed in Japanese Unexamined Patent Application Publication No. 3-258107, which discloses a chip electronic component having a pair of external electrodes provided on both ends of a rectangular electronic component element. In this chip electronic component, the external electrodes located at both ends are arranged to be wound on the upper surface, a pair of side surfaces, and the lower surface on the respective ends of the electronic component element, and also to cover both end surfaces thereof. In the same publication, another electronic component is described as including external electrodes that are arranged such that they do not extend to the end surfaces.

Japanese Unexamined Patent Application Publication No. 6-224681 discloses a chip piezoelectric resonant having three external electrodes on the outer surface of a piezoelectric resonant having a rectangular board shape. This chip piezoelectric resonator has a pair of external electrodes provided on both ends of the resonator so as to cover the upper surface, a pair of side surfaces, the lower surface and the end surfaces thereof, and the third external electrode is wound between the pair of external electrodes located on both ends so as to cover the upper surface, a pair of side surfaces and the lower surface thereof. In case where the lower surface is a surface on which the electronic component is mounted, the third external electrode is provided on the upper surface with a recessed portion and a projected portion, each having a width different from that of the remaining portion. The third electrode is arranged to take a capacitance out and so that a desired capacitance may be obtained by adjusting the size of a recessed portion and a projecting portion provided on the upper surface thereof.

When the capacitance is increased, the width of the recessed portion and the projecting portion are increased as well, whereby it is situated closer to the external electrode on the other end. However, the width of the third external electrode on the lower surface (mounting surface) is reduced to prevent short-circuiting.

In addition, disclosed in Japanese Unexamined Patent Application Publication No. 5-83074 is a chip electronic component including a piezoelectric element mounted on a case substrate, and a metallic cap bonded on the case substrate such that it surrounds the piezoelectric element. In the chip electronic component of this type, the case substrate is provided with a through hole electrode, one end of which is electrically connected to the piezoelectric element and the other end of which extends to the lower surface of the case substrate. By arranging the portion of the through hole electrode to extend to the lower surface of the case substrate, the chip electronic component can be mounted on the surface of the printed circuit board. Therefore, it is bonded to the printed circuit board by soldering between the lower surface of the case substrate and the printed circuit board.

When the chip electronic component described in the related art section of Japanese Unexamined Patent Application Publication NO. 3-258107 is mounted on the printed circuit board, the presence of the external electrodes on the side surfaces and the end surfaces of the electronic component element results in formation of a solder fillet thereon. In other words, a solder fillet is formed along the side surfaces and end surfaces of the electronic component element extending in a direction that is perpendicular to the printed circuit board. Therefore, the distances between adjacent chip electronic components cannot be reduced, and thus, high-density mounting is prevented.

Due to formation of the solder fillet, when warpage occurs on the printed circuit board, the chip electronic components are susceptible to a stress caused by the solder fillet. As a result, the bonded portions between the solder fillet and the chip electronic components are susceptible to separation. In addition, the costs of the external electrodes are increased because the external electrodes are arranged to cover the end surfaces in addition to the upper surface, the pair of side surfaces, and the lower surface.

On the other hand, in the chip electronic component disclosed in Japanese Unexamined Patent Application Publication No. 3-258107, the external electrodes do not cover the end surfaces. Therefore, the cost of the external electrodes is reduced in comparison with the chip electronic component disclosed in Japanese Unexamined Patent Application Publication No. 3-258107. However, because the three external electrodes are wound on the upper surface, the pair of side surfaces, and the lower surface of the electronic components, when component is mounted on the printed circuit board, solder tends to deposit along the portion of the external electrode located on the side surface of the electronic component elements and thereby forming solder fillets. Therefore, when warpage of the printed circuit board occurs in the direction of the width of the electronic component element, the chip electronic component is susceptible to an external stress caused by the solder fillets, thereby being susceptible to separation of the bonded portion between solder and the chip electronic components.

High density mounting is possible in the longitudinal direction because solder fillets are not formed on the end surfaces on both longitudinal ends of the electronic component element. However, in the direction of width, formation of solder fillets prevents high-density mounting.

In the chip electronic component disclosed in Japanese Unexamined Patent Application Publication No. 5-83074, the circuit provided in the electronic components is led to the bottom surface of the case substrate via a through hole electrode. Therefore, it is not necessary to provide the external electrode on the side surfaces and the end surfaces of the case. As a result, the mounting density in the direction of both length and width of the electronic component is increased. In addition, since no external electrode exists on the side surfaces and the end surfaces of the case substrate, solder fillets are not formed. Thus, stress caused by warpage of the printed circuit board is reduced in the chip electronic component, thereby increasing stability of the bonded portion.

However, in this type of the chip electronic component, through hole electrodes must be formed on the case substrate, which increases the complexity of the manufacturing process of the case substrate. Further, the mechanical strength of the case substrate decreases due to formation of through hole electrodes.

SUMMARY OF THE INVENTION

To overcome the above-described problems, preferred embodiments of the present invention provide a chip electronic component and a mounting structure for the same that is not susceptible to stress caused by warpage of the substrate on which it is mounted, thereby ensuring a reliable electrical connection and a strong mechanical bond, and, further, simplifying the manufacture of the chip electronic component and mounting structure thereof, without requiring complicated manufacturing processes.

A chip electronic component according to a first preferred embodiment of the present invention includes a circuit provided in the electronic component, an electronic component element having a lower surface and a pair of side surfaces, and a plurality of external electrodes arranged to extend over the lower surface and to at least one of the side surfaces of the electronic component element and electrically connected to the circuit therein, wherein each external electrode portion provided on the lower surface of the electric component element is provided with a narrow portion and a wide portion.

In a specific aspect of the chip electronic component according to the first preferred embodiment of the present invention, the relation $L_1 < L_2 < L_3$ is preferably satisfied, where $L_1$ is the width of the external electrode portion located on the side surface of the electric component element, $L_2$ is the width of the narrow portion, and $L_3$ is the width of the wide portion.

The chip electronic component according to a second preferred embodiment of the present invention preferably includes a circuit provided in the electronic component, an electronic component element having a lower surface and a pair of side surfaces, and a plurality of external electrodes arranged to extend over the lower surface and at least one of the side surfaces of the electronic component element and electrically connected to the circuit therein, wherein each external electrode portion on the lower surface of the electronic component element is arranged to have a substantially uniform width from one longitudinal end to the other longitudinal end, and satisfies the relation $L_1 < L_3$, where $L_3$ is the width of the external electrode portion on the lower surface of the electronic component element, and $L_1$ is the width of the external electrode portion provided on the side surface of the electronic component element.

In the first and second preferred embodiments of the present invention, electronic components having various functions can be used, however, in one specific preferred embodiment of the present invention, a piezoelectric resonant component is preferably constructed.

Although the piezoelectric resonant component described above may have various configurations, the component preferably includes a piezoelectric resonant element and a first case substrate provided on at least one surface of the piezoelectric resonant element bonded so as not to interfere with the vibration of the piezoelectric resonant element of the first and second preferred embodiments of the present invention.

According to another preferred embodiment of the invention, the second case substrate is laminated on the upper surface of the piezoelectric resonant element so as not to interfere with the vibration of the piezoelectric resonant element.

According to another preferred of the present invention, the chip electronic component is provided with a cap member mounted on the upper surface of the first case substrate such that it surrounds the piezoelectric resonant element.

The mounting structure of the chip electronic component according to preferred embodiments of the present invention includes a printed circuit board, and a chip electronic component according to preferred embodiments of the present invention mounted on the printed circuit board via a conductive bond, wherein the bonded portion provided by the conductive bond is located inside of the outer periphery of the chip electronic component as seen from the top of the chip electronic component.

Other features, characteristics, elements and advantages of the present invention will become apparent from the following description of preferred embodiments thereof with reference to the attached drawings.

DETAILED DESCRIPTION OF PREFERRED EMBODIMENTS

Figure 1:
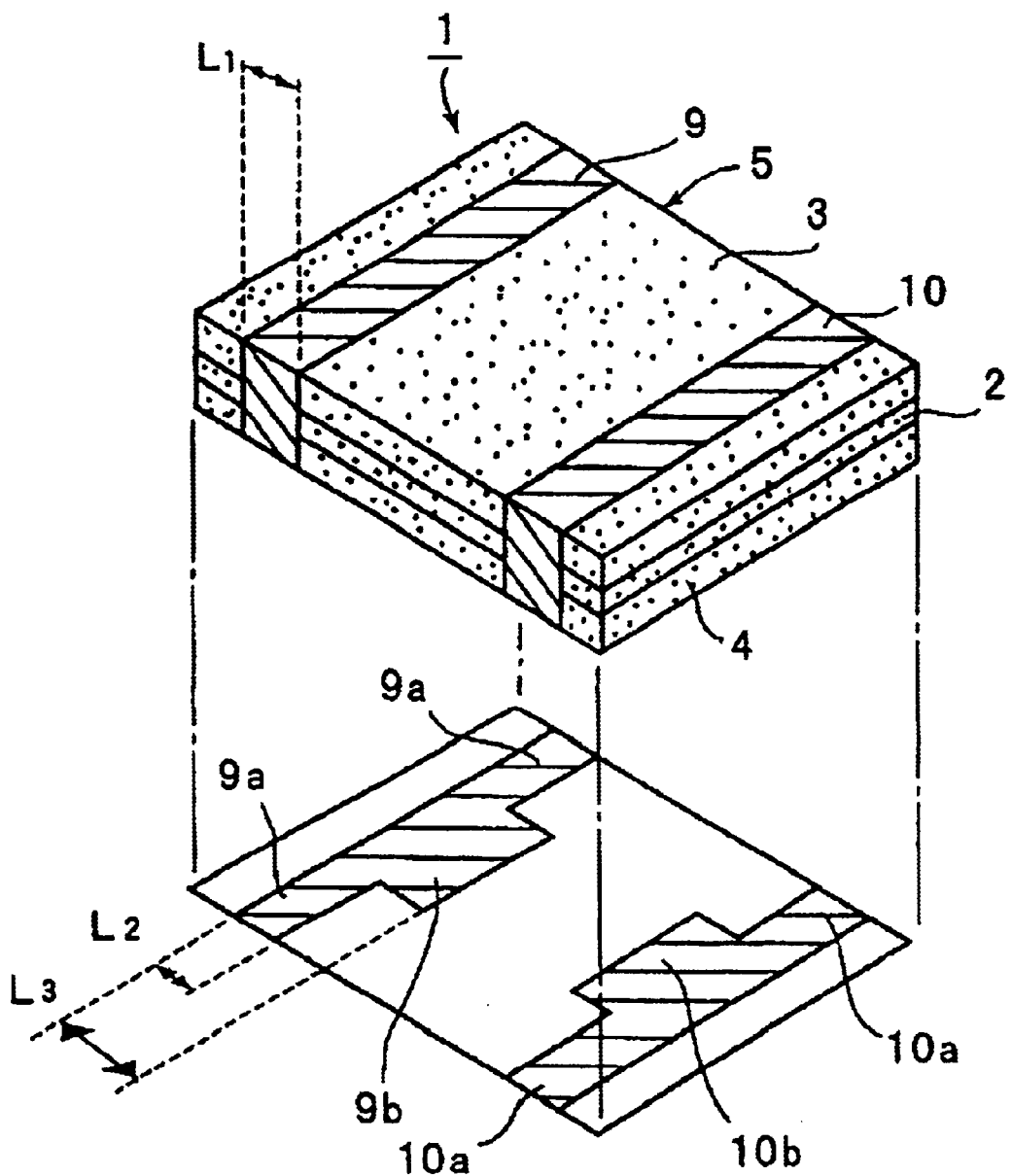
FIG. 1 is a perspective view showing a chip electronic component according to a first preferred embodiment of the present invention.

Referring now to the drawings, the chip electronic component and the mounting structure thereof according to preferred embodiments of the present invention will be described.

FIG. 1 is a perspective view showing the chip electronic component according to a first preferred embodiment of the present invention. The chip electronic component 1 includes a monolithic body 5 formed by laminating the case substrates 3 and 4 on both sides of piezoelectric resonant element 2 as an electronic component element. The monolithic body 5 is shown in an exploded perspective view in FIG. 2. The piezoelectric resonant element 2 includes a substantially rectangular plate shaped piezoelectric board 6 of a piezoelectric ceramic, such as lead zirconate titanate ceramic. The piezoelectric board 6 is polarized in the direction of the thickness. In the approximate center of the upper surface of the piezoelectric board 6, a first vibrating electrode 7a is provided, and in the approximate center of the lower surface, a second vibrating electrode 8a is provided. The vibrating electrodes 7a and 8a are opposed to each other on the upper side and the lower side with the piezoelectric board 6 therebetween.

The vibrating electrode 7a is connected to a terminal electrode 7c via an extending electrode 7b. The vibrating electrode 8a is electrically connected to a terminal electrode 8c via an extending electrode 8b.

The first case substrate 3 is laminated on the upper surface of the piezoelectric resonant element 2, and the second case substrate 4 is laminated on the lower surface of the piezoelectric resonant element 2. As is apparent from FIG. 2, a recess portion 4a is provided on the upper surface of the case substrate 4. The same recess portion is also formed on the lower surface of the case substrate 3, though it is not shown specifically. The recess portion 4a is provided for defining a space for allowing for free and unhindered vibrations of the piezoelectric vibrating portion of the energy-trap type produced by the vibrating electrodes 7a and 8a.

Therefore, the monolithic body 5 acts as an energy trap type piezoelectric resonant component using a perpendicular vibrating mode by applying an alternating voltage between the terminal electrodes 7c and 8c.

Figure 2:
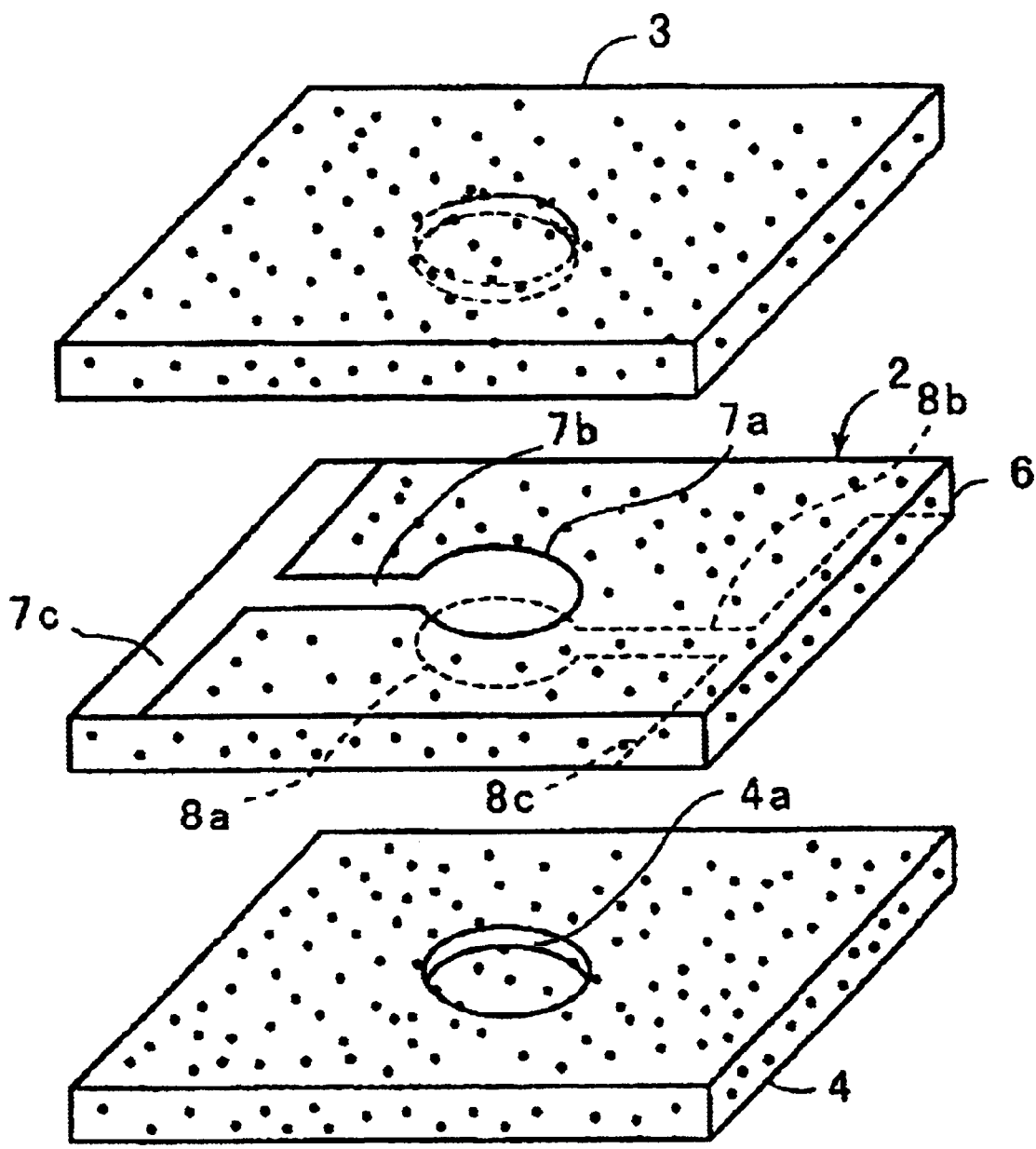
FIG. 2 is an exploded perspective view showing a monolithic body of the chip electronic component according to the first preferred embodiment.

As is apparent from FIG. 2, the terminal electrodes 7c and 8c are arranged to extend to both end portions along the width thereof.

Returning to FIG. 1, the outer surface of the monolithic body 5 is provided with first and second external electrodes 9 and 10. The external electrodes 9 and 10 are preferably substantially ring-shaped so as to wrap around the upper surface, a pair of side surfaces and the lower surface of the monolithic body 5.

The external electrodes 9 and 10 are preferably formed by applying Cu or Ag by thin film formation such as vapor deposition, plating or sputtering, or by thick film plating, or other suitable process.

The external electrodes 9 and 10 are electrically connected to the terminal electrodes 7c or 8c at an external electrode portion located on the side surface.

The external electrodes 9 and 10 are configured to have a width $L_1$ on the upper surface and the pair of side surfaces of the monolithic body 5. Further, the external electrodes 9 and 10 are configured to have narrow portions 9a, 9a, 10a, and 10a, and wide portions 9b and 10b on the lower surface. In this preferred embodiment, the wide portions 9b and 10b project from the end portions toward the center portion of the monolithic body 5 thereby defining a substantially rectangular shape as seen from the top. The wide portions 9b and 10b are located in an approximately central portion between the longitudinal sides of the monolithic body 5, and narrow portions 9a, 9a, 10a, and 10a are arranged on both sides of the wide portions 9b and 10b.

In the chip electronic component 1 of this preferred embodiment, the relationship $L_1 < L_2 < L_3$ is satisfied, where $L_2$ is the width of the narrow portions 9a and 10a, and $L_3$ is the width of the wide portions 9b and 10b.

Figure 3:
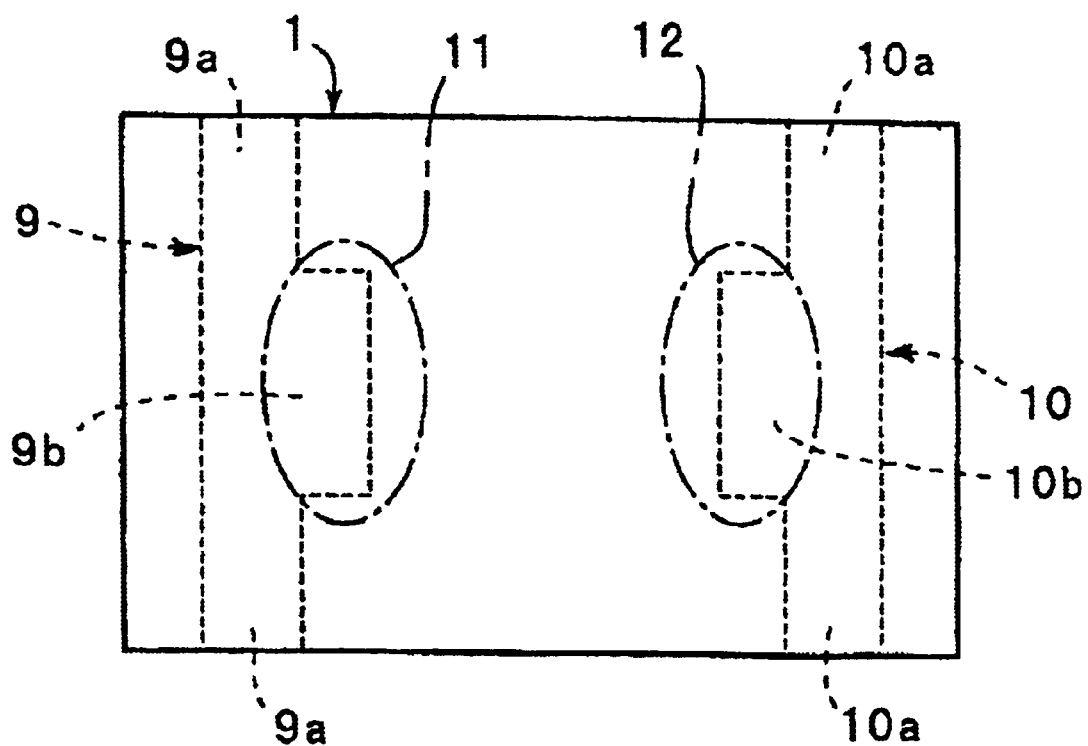
FIG. 3 is a plan view in schematic form showing a mounting structure using the chip electronic component according to the first preferred embodiment.

The chip electronic component 1 of this preferred embodiment is mounted on the printed circuit board with the lower surface of the chip electronic component 1 contacting the printed circuit board. In this case, since there are wide portions 9b and 10b provided on the lower surface, an excess of solder deposited on the portion of the external electrode 9 and 10 located on the lower surface of the chip electronic component 1 is deposited on the wide portions 9b and 10b. Therefore, as shown in a plan view shown schematically in FIG. 3, solder 11 and 12 is not deposited outside of the side surface of the chip electronic component 1 in a mounted structure. Especially, since the narrow portions 9a, 9a, 10a, and 10a are provided on the sides of the wide portions 9b and 10b, the tendency of the melted solder to flow toward the narrow portions 9a and 10a is substantially reduced.

Therefore, when mounted on a printed circuit board, since solder is not deposited in portions of the external electrodes 9 and 10 located on the side surfaces of the chip electronic component 1, formation of solder fillets on those portions is prevented. In this way, no solder fillets exist along the length and width of the chip electronic component 1, thereby enabling increased mounting density.

Where solder fillets are formed, the chip electronic component is susceptible to a stress caused by warpage of the printed circuit board. However, the chip electronic components 1 according to this preferred embodiment has no solder fillets existing thereon, therefore stress caused by warpage of the printed circuit board is greatly reduced, and thereby reliability of bonding is substantially increased.

In addition, the formation of the narrow portions 9a and 10a and the wide portions 9b and 10b does not require a complicated process on the case substrates 3 and 4, so that the case substrates 3 and 4 are easily manufactured.

Unlike the chip electronic component of the prior art in which a through hole is formed in the case substrate, because no mechanical process is performed on the case substrates 3, there is no reduction of the mechanical strength.

While the wide portions 9b and 10b of the chip electronic component 1 according to the first preferred embodiment are preferably substantially rectangular, the wide portion may also be configured in other suitable shapes.

Figure 4A:
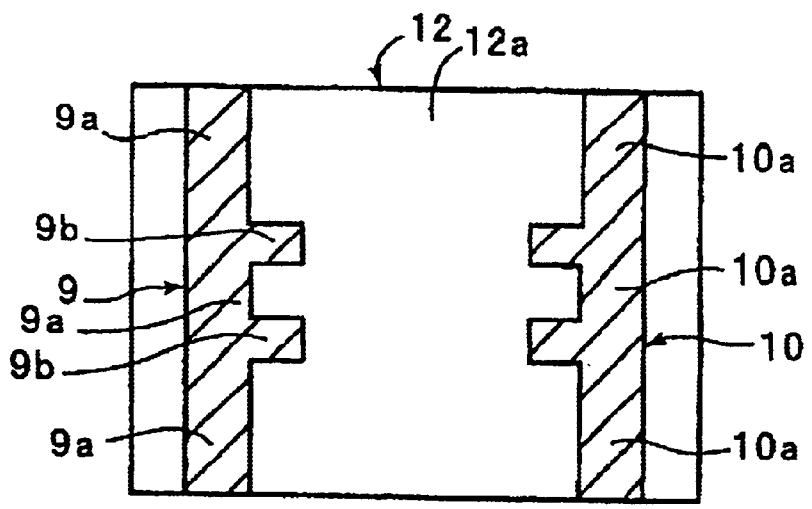
FIGS. 4A to 4C are bottom views showing alternative variations of the chip electronic component according to the first preferred embodiment.
Figure 4B:
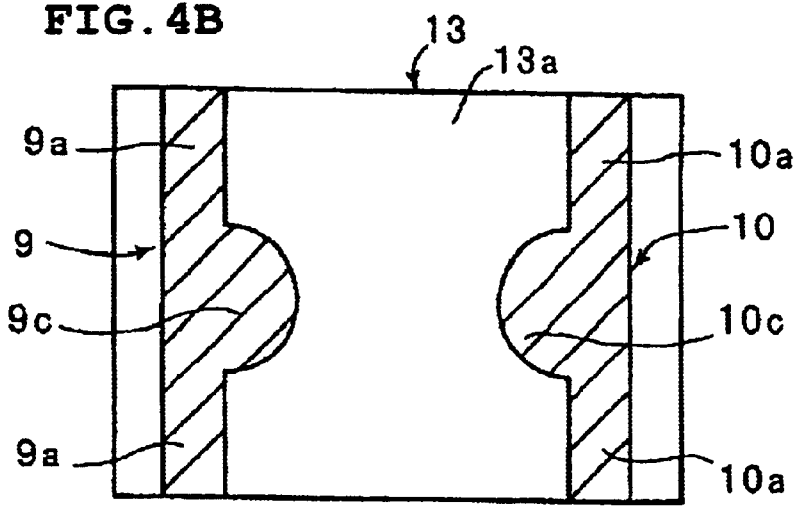
Figure 4C:
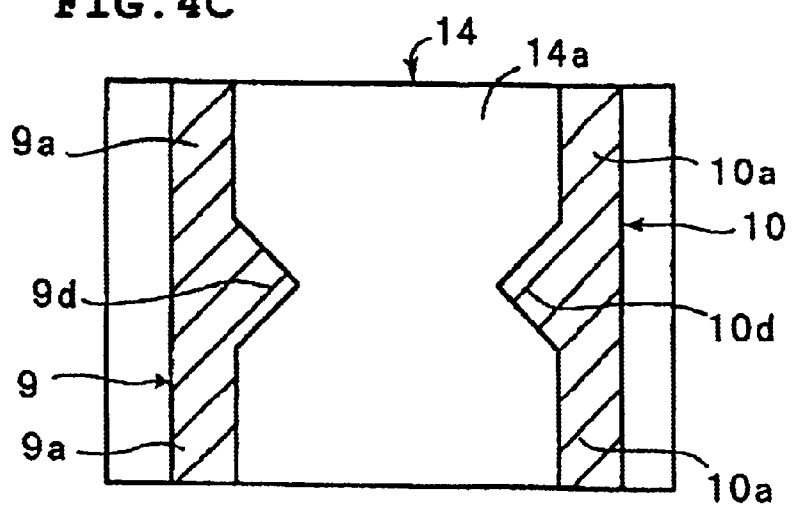

FIGS. 4A to 4C are bottom views showing alternative variations of the configuration of the wide portions.

In the chip electrode component 12 shown in FIG. 4A, the external electrodes 9 and 10 are provided across the bottom surface 12a, and the external electrodes 9 and 10 are provided with a pair of wide portions 9b, 9b, 10b, and 10b in the approximately central portion between longitudinal sides of the chip electrode component 12. In this way, it is also possible to form a plurality of wide portions on one external electrode.

In the chip electronic component 13 shown in FIG. 4B, wide portions 9c and 10c being almost semicircular in plan view are provided on the bottom surface 13a thereof.

In the chip electronic component 14 shown in FIG. 4C, wide portions 9d and 10d being almost triangular in plan view are provided on the bottom surface 14a thereof.

Figure 5:
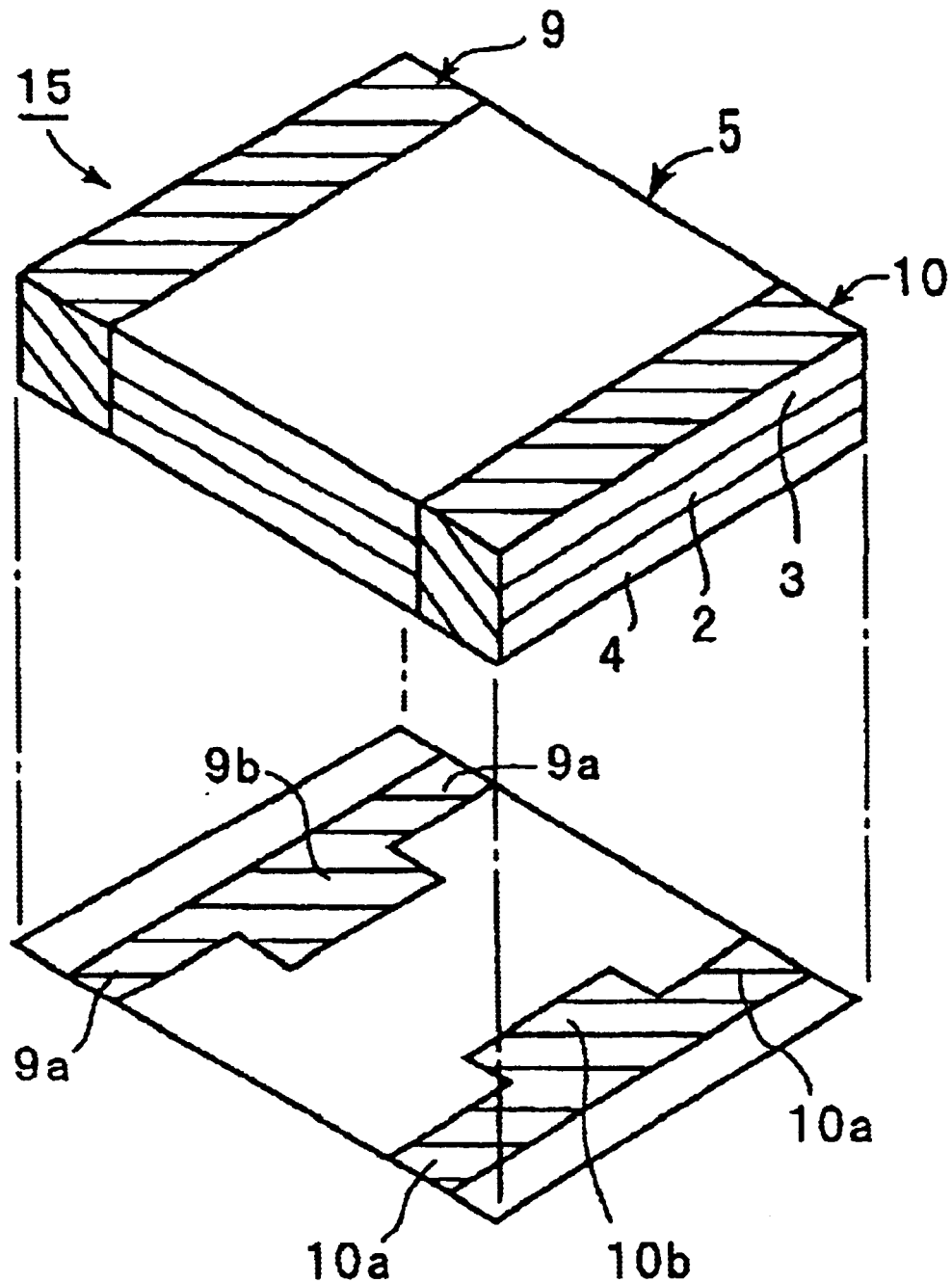
FIG. 5 is a perspective view showing another alternative variation of the chip electronic component according to the first preferred embodiment.

FIG. 5 is a perspective view showing another alternative variation of the chip electronic components according to the first preferred embodiment. While the external electrodes 9 and 10 are provided on the chip electronic components 15 shown in FIG. 5 to be wound on the upper surface, the pair of side surfaces and the lower surface of the monolithic body 5, the external electrodes 9 and 10 are provided on the upper surface and the pair of side surfaces of the monolithic body 5 so as to extend to the ends thereof. Other elements are provided in the same manner as in the first preferred embodiment. In this way, the external electrodes 9 and 10 are provided on the upper surface and the pair of side surfaces of the monolithic body 5 so as to extend to the ends thereof.

Figure 6:
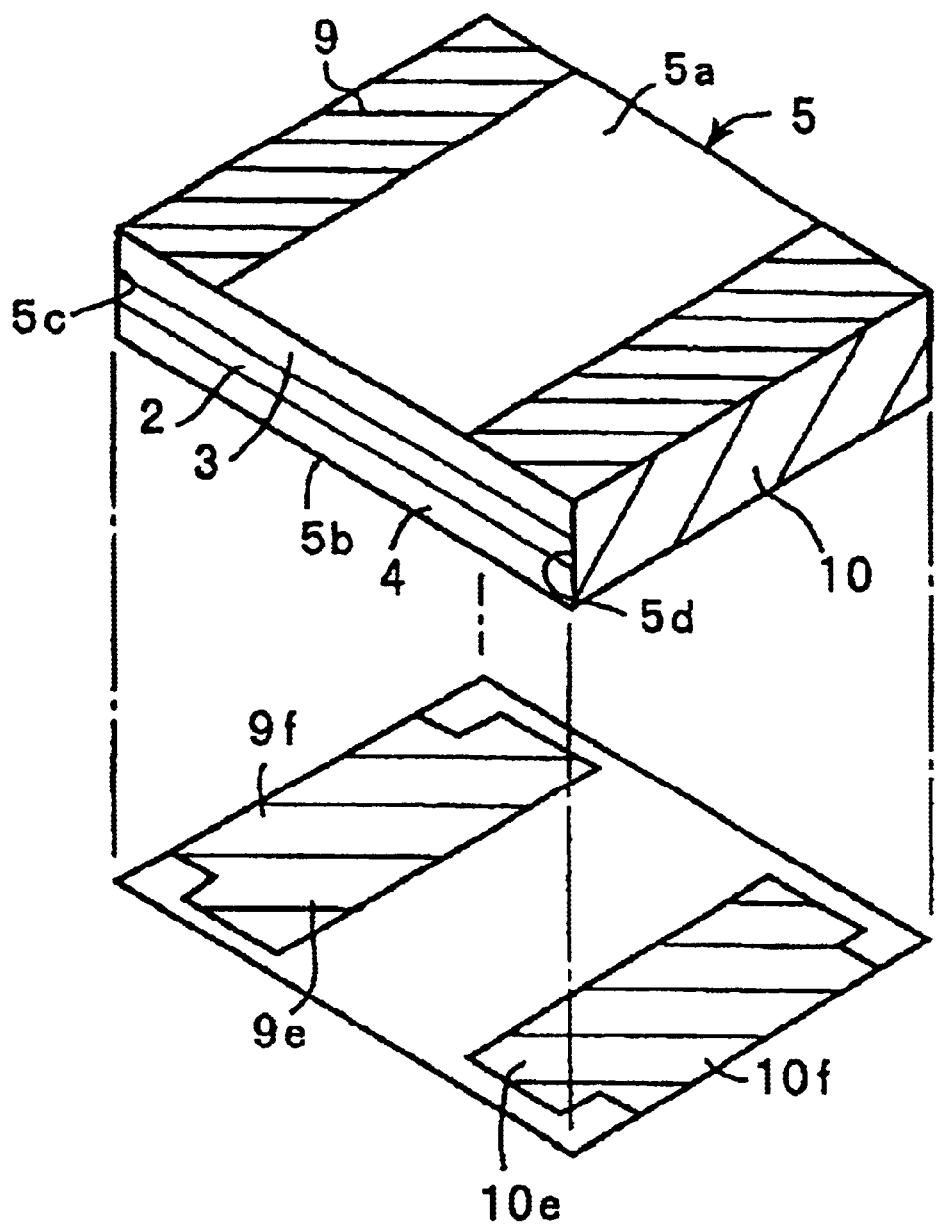
FIG. 6 is a perspective view showing still another alternative variation of the chip electronic component according to the first preferred embodiment.

FIG. 6 is a perspective view showing another alternative variation of the chip electronic component 1. In the chip electronic component 16, the external electrodes 9A and 10A are arranged to extend over the upper surface 5a, end surfaces 5c and 5d, and the lower surface 5b of the monolithic body 5. In other words, the external electrodes 9 and 10 do not extend over the side surface. Therefore, since the external electrodes 9 and 10 are arranged to extend from the upper surface via the end surface to the lower surface, respectively, the longitudinal direction of the external electrode is defined to be the direction connecting the upper surface, the end surface, and the lower surface. Therefore, when the longitudinal direction is defined as described above, the direction of the width of the external electrode is defined to be the direction that is substantially perpendicular to the longitudinal direction.

On the lower surface 5b, the external electrodes 9 and 10 have wide portions 9e and 10e, respectively. The narrow portions 9f and 10f extend from the wide portion 9e and 10e to the edges defined by the lower surface 5b and the end surfaces 5c and 5d.

Since the wide portions 9e and 10e are provided in this preferred embodiment as well, melted solder does not overflow toward the narrow portions 9f and 10f, whereby the solder is not deposited along the end surfaces 5c and 5d of the monolithic body 5, and thus formation of solder fillets is reliably prevented as in the first preferred embodiment.

Figure 7:
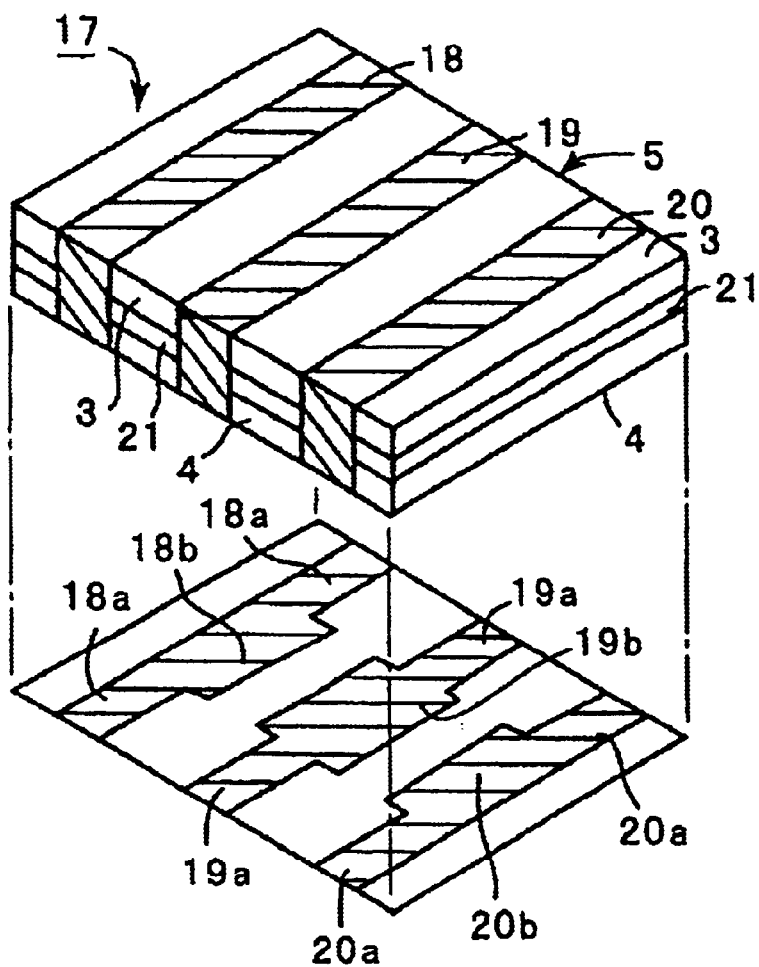
FIG. 7 is a perspective view showing still another alternative variation of the chip electronic component according to the first preferred embodiment.

In the chip electronic component 17 of another alternative variation shown in FIG. 7, first, second and third external electrodes 18 to 20 are provided. The external electrodes 18 to 20 are provided in a similar manner as the chip electronic components 9 and 10 according to the first preferred embodiment. In other words, the external electrodes 18 and 20 have narrow portions 18a, 18a, 20a, and 20a, and wide portions 18b and 20b at the portions located on the lower surface of the chip electronic component 17. On the other hand, the external electrode 19 located between the external electrodes 18 and 29 has narrow portions 19a, and a wide portion 19b on the lower surface of the chip electronic component 17. The wide portion 19b is preferably substantially rectangular in plan view, but, unlike wide portions 18b and 20b, wide portion 19b projects toward both sides along the length of the chip electronic component 17.

Therefore, as in the chip electronic component 1 of the first preferred embodiment, the external electrodes 18 to 20 have narrow portions and wide portions respectively, formation of solder fillets is prevented and thereby the mounting density is substantially increased, and the bonding stability is substantially improved when mounted onto the printed circuit board.

Figure 8:
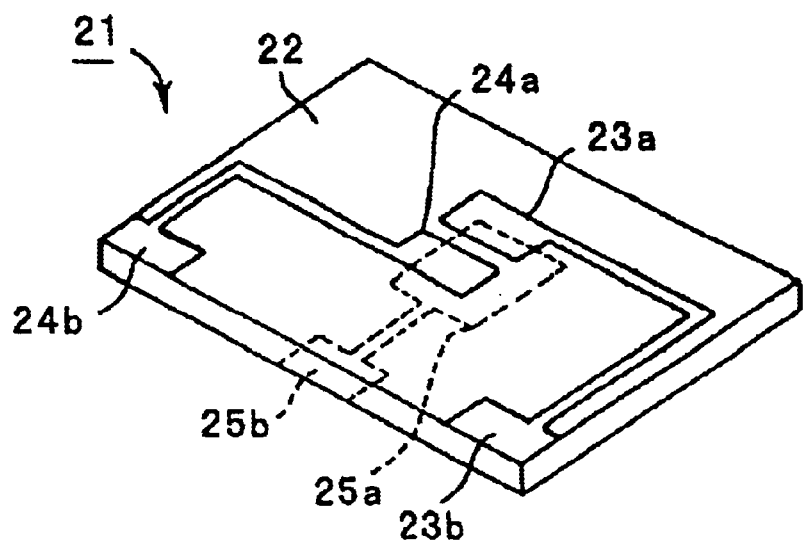
FIG. 8 is an exploded perspective view showing a monolithic body of the chip electronic component according to the alternative variation shown in FIG. 7.

The electronic component element 21 used in the chip electronic component 17 is shown in a perspective view in FIG. 8. The electronic component element 21 is an energy trap type piezoelectric filter using the perpendicular vibrating mode. The electronic component element 21 is provided with a pair of vibrating electrodes 23a and 24a on the upper surface of the piezoelectric board 22. The vibrating electrode 23a is electrically connected to a terminal electrode 23b provided at one corner portion of the piezoelectric board 22, and the vibrating electrode 24a is electrically connected to the terminal electrode 24b formed at another corner portion. The lower surface of the piezoelectric board 22 is provided with a common vibrating electrode 25a thereon. The common vibrating electrode 25a is connected to a terminal electrode 25b provided in an approximately central portion of the longitudinal edge of the piezoelectric board 22.

The terminal electrodes 24b, 23b are electrically connected to the external electrodes 18 and 20 described above, respectively, and the terminal electrode 25b is electrically connected to the external electrode 19.

In the chip electronic component 17, the electronic component element is not limited to the electronic component element 21 shown in FIG. 8, and any appropriate piezoelectric element of three-terminal type may be used.

Figure 9:
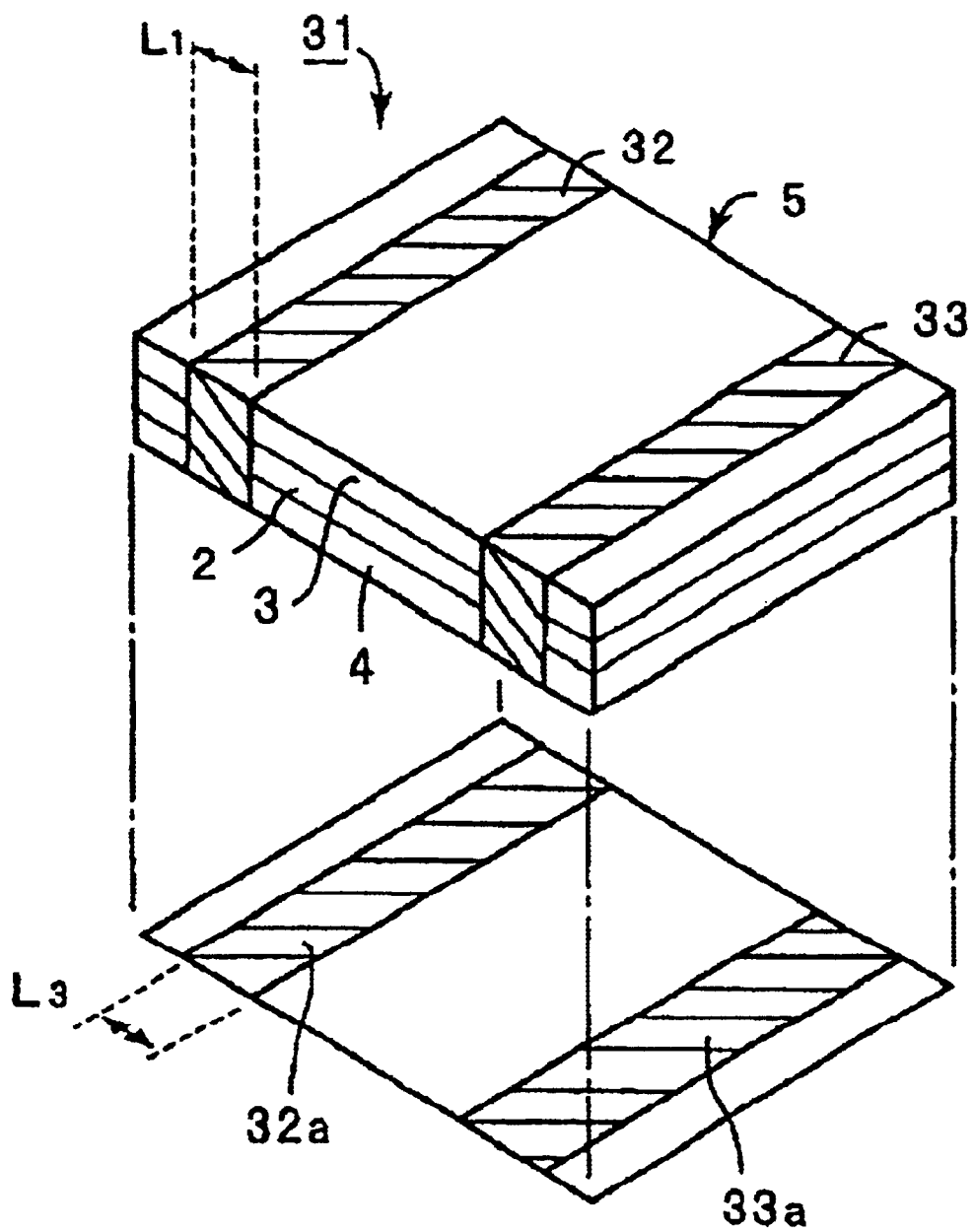
FIG. 9 is a perspective view of the chip electronic component according to a second preferred embodiment of the present invention.

FIG. 9 is a perspective view showing a chip electronic component according to a second preferred embodiment of the present invention. The chip electronic component 31 is provided with a monolithic body 5 having a circuit that defines an electronic component therein. The monolithic body 5 preferably has substantially the same structure as the monolithic body of the first preferred embodiment. In other words, it includes case substrates 3 and 4 mounted on both surfaces of the piezoelectric resonant element 2.

In this preferred embodiment, first and second external electrodes 32 and 33 are provided to be wound on the upper surface, a pair of side surfaces, and the lower surface of the monolithic body 5. Each external electrode 32 and 33 is in the shape of a strip having a width of $L_1$ on the upper surface and the pair of side surfaces of the monolithic body 5, and in the shape of a strip having a width of $L_3$ on the lower surface of the monolithic body 5, such that $L_1 < L_3$.

The chip electronic component 31 of the present preferred embodiment is formed in such that the width $L_3$ of the external electrode portion 32a and 33a on the lower surface of the monolithic body 5 is greater than the width $L_1$ of the external electrode portion located on the pair of side surfaces of the monolithic body 5.

Therefore, when the chip electronic component 31 is mounted on the printed circuit board by bonding the portion near the approximate central portion of the external electrode portions 32a and 33a of the external electrodes 32 and 33 located on the lower surface of the monolithic body 5 by soldering, melted solder does not flow to the side surface of the monolithic body 5.

Since the widths of the external electrode portions $L_3$ are increased, the areas of the external electrode portions 32a and 33a are also increased, and therefore melted solder remains on the lower surface of the monolithic body 5, which is bonded to the electrodes (not shown) on the printed circuit board.

Therefore, since solder is not deposited on the external electrode portion located on the side surface of the monolithic body 5, formation of solder fillets is reliably prevented. Consequently, the mounting density is increased and the reduced bonding strength caused by solder fillets is prevented as in the first preferred embodiment.

Figure 10:
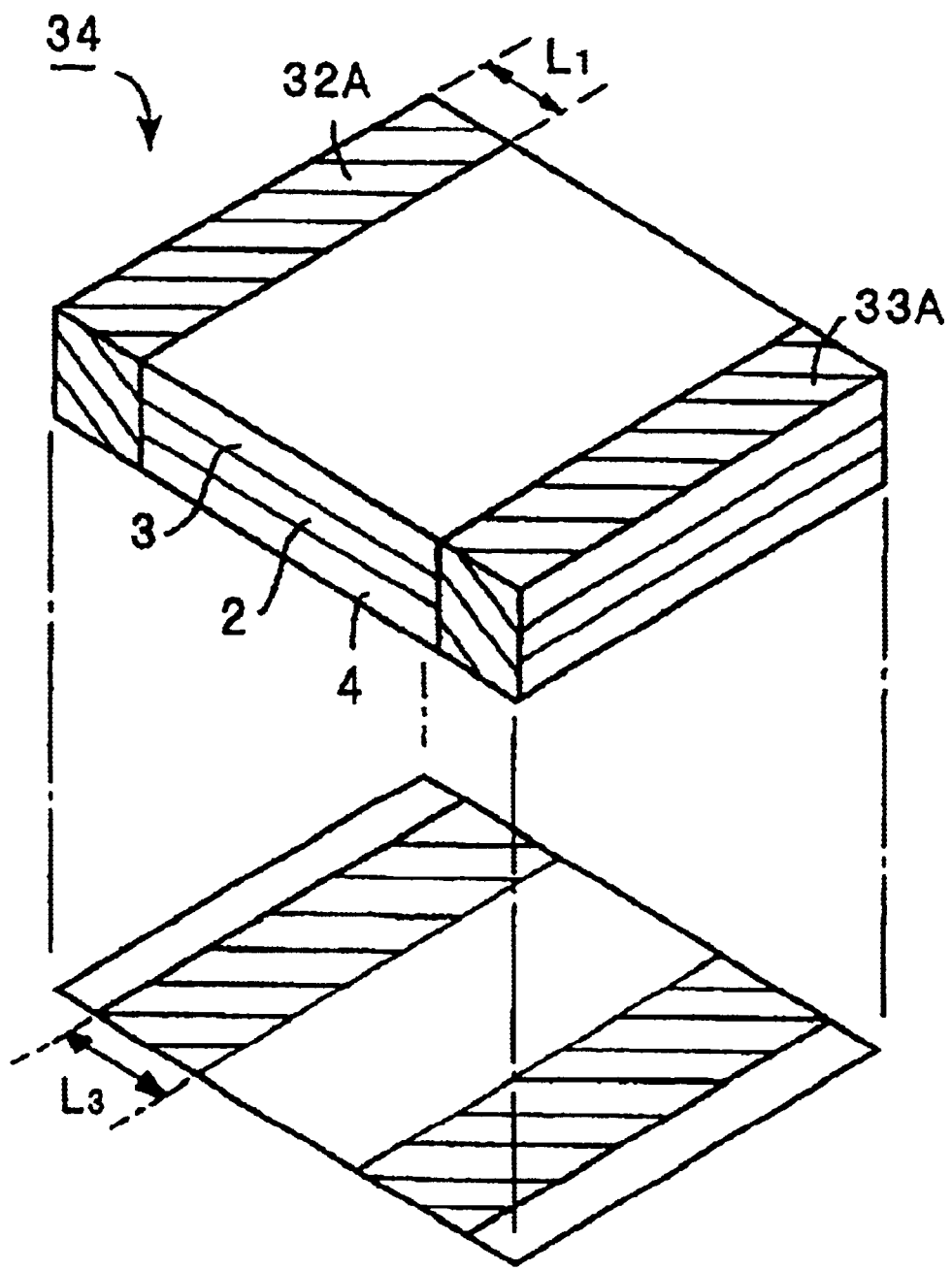
FIG. 10 is a perspective view showing an alternative variation of the chip electronic component according to the second preferred embodiment.

FIG. 10 is a perspective view showing the alternative variation of the chip electronic component according to the second preferred embodiment. The chip electronic component 34 shown in FIG. 10 is provided with external electrodes 32A and 33A on the upper surface and the pair of side surfaces of the monolithic body 5 so as to extend to the shorter ends thereof. In other respects the external electrodes 32A and 33A are the same as the chip electronic component 31 shown in FIG. 9.

Figure 11:
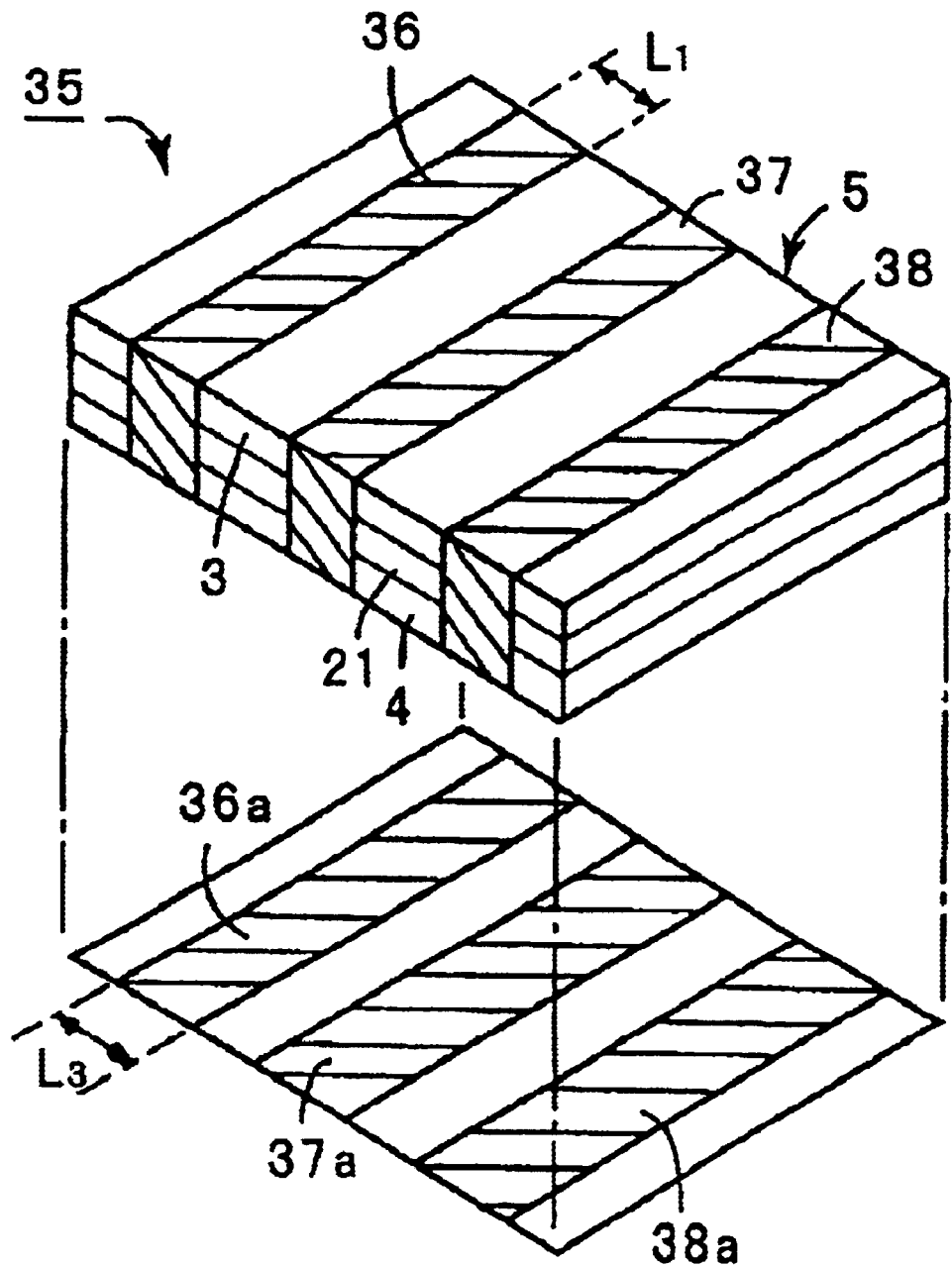
FIG. 11 is a perspective view showing another alternative variation of the chip electronic component according to the second preferred embodiment.

FIG. 11 is a perspective view of still another alternative variation of the chip electronic component 31 according to the second preferred embodiment. The chip electronic component 35 is provided with a first to third external electrodes 36 to 38 provided on the outer surface of the monolithic body 5. The monolithic body 5 is constructed in the same manner as the chip electronic component 17 shown in FIG. 7.

The first to third electrodes 36 to 38 are provided in the same manner as the external electrodes 32 and 33. In other words, the width $L_3$ of the external electrode portions 36a, 37a, and 38a located on the lower surface of the monolithic body 5 is greater than the width $L_1$ of the rest of the external electrode portion. Therefore, as in the chip electronic component 31, the mounting density is substantially increased and the reduced bonding strength caused by solder fillets is prevented.

In the chip electronic component according to the first and second preferred embodiments, the case substrates are laminated on both surfaces of the piezoelectric resonant element. However, the chip electronic component according to the invention is not limited to the laminated type, but is applicable to the chip electronic components of various constructions.

Figure 12:
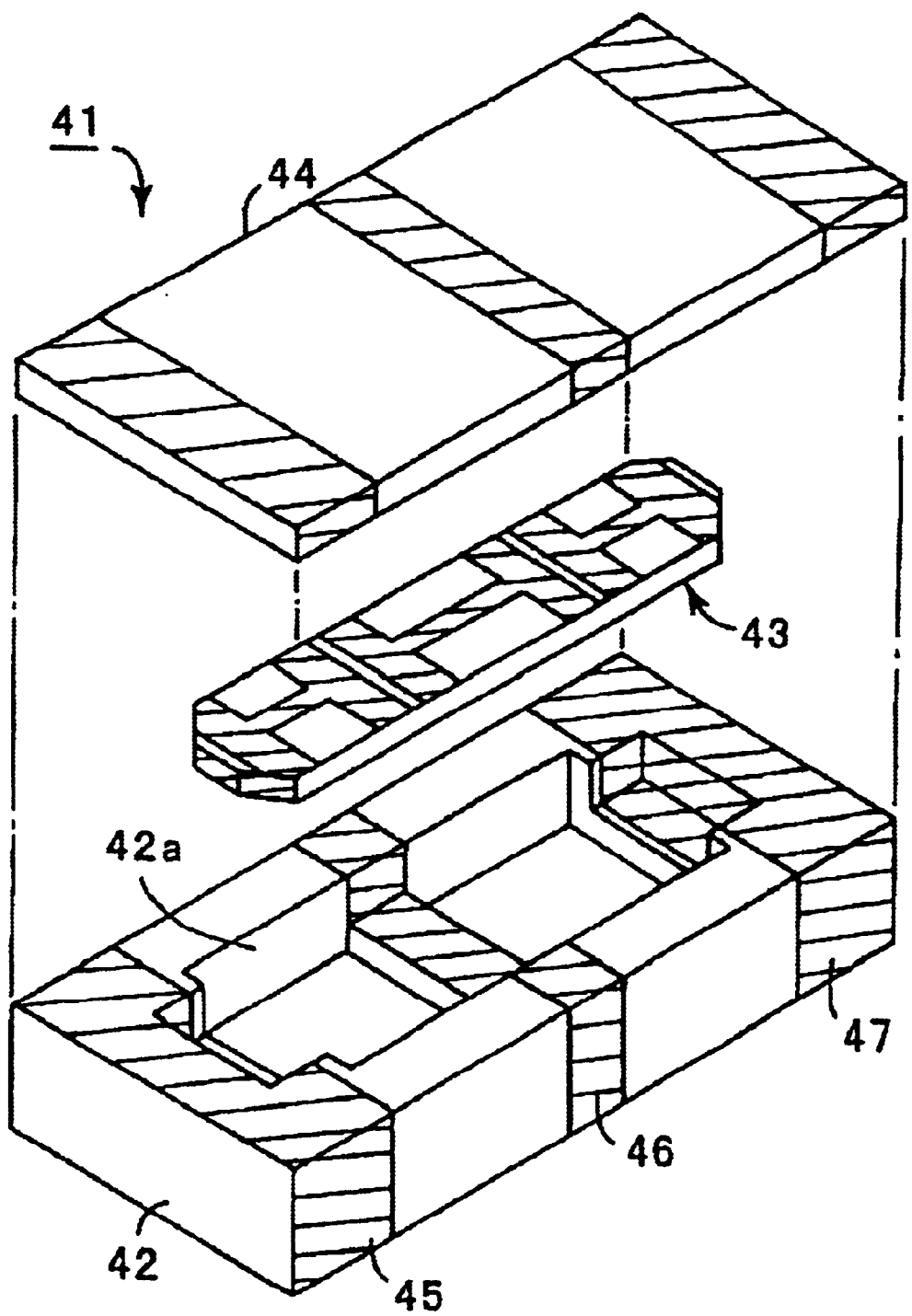
FIG. 12 is an exploded perspective view showing still another alternative variation of the chip electronic component.
Figure 13:
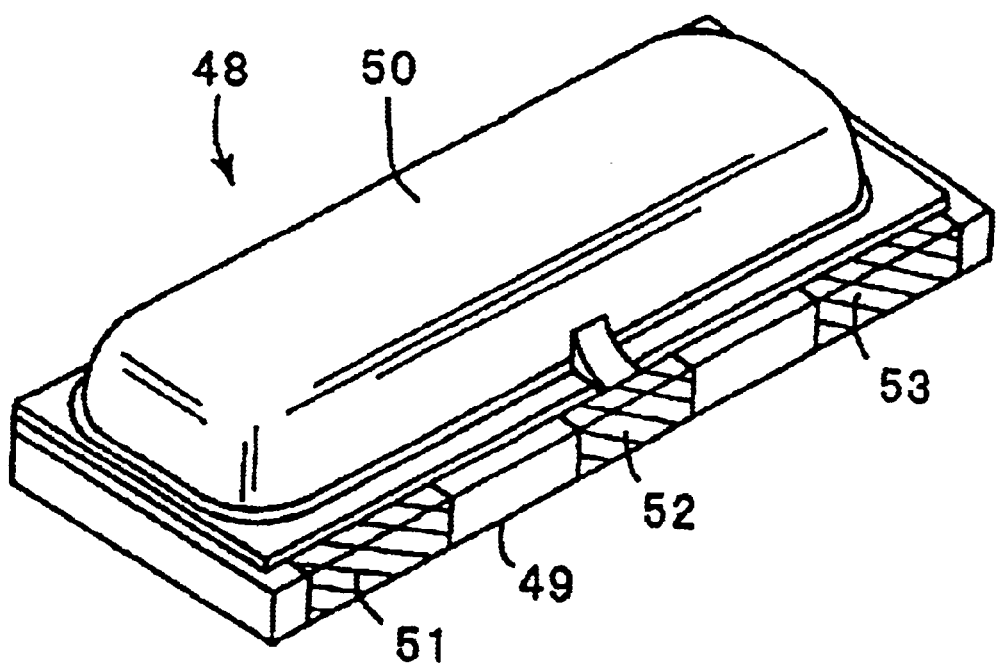
FIG. 13 is a perspective view showing still another alternative variation of the chip electronic component to which the invention is applied.

FIG. 12 and FIG. 13 are perspective views showing a chip electronic component to which preferred embodiments of the present invention is applied.

The chip electronic component 41 shown in FIG. 12 includes a first case material 42 constructed of an insulating ceramic having an opening that opens upwardly, and a piezoelectric filter element 43 disposed therein. The cover material 44 as a second case material is bonded to the first case material 42 in such that it covers the opening 42a into which the piezoelectric filter element 43 is disposed. On the outer surface of the substantially rectangular electronic component, first, second and third external electrodes 45 to 47 are provided. The external electrodes 45 to 47 are electrically connected to the piezoelectric filter element 43 disposed therein. The external electrodes 45 to 47 are respectively provided to extend over the upper surface, the pair of side surfaces and the lower surface of the case, and the external electrode portion extending to the lower surface is provided in the same manner as in the first and second preferred embodiments.

The chip electronic component 48 shown in FIG. 13 is provided with a piezoelectric resonant component, not shown specifically, mounted on a first case substrate 49, and a second case substrate in the form of a cap 50 is bonded to the case substrate 49 so as not to interfere with the vibration of the piezoelectric resonant component in such a manner that it surrounds the piezoelectric resonant component. The case substrate 49 is provided with external electrodes 51 to 53 electrically connected to the piezoelectric resonant component provided thereon. The external electrodes 51 to 53 are provided to extend from the upper surface via the side surface to the lower surface, and the external electrode portion on the lower surface is formed in the same manner as in the first and second preferred embodiments.

In this way, the chip electrode component to which the present invention is applied is not limited to the chip electrode component including case substrates laminated on the upper surface and the lower surface of the electric component element, and it is generally applied to chip electronic components using various types of case materials.

While the chip electronic components according to the first and second preferred embodiments are provided with external electrodes on the upper surface of the electronic component elements, the chip electronic components according to the first and second preferred embodiments of the present invention may not be provided with external electrodes on their upper surfaces. It is not necessary to form the external electrode so as to extend over both of the pair of side surfaces. In other words, as far as the external electrode is formed over one side surface and the lower surface, the mounting density is increased and the stability of bonding is substantially improved as in the first and second preferred embodiment by providing the wide portion on the external electrode portion located on the lower surface of the electronic component element, or by configuring the external electrodes to have a width on the portion located on the lower surface to be wider than the width of the external electrode portion located on the side surface.

The chip electronic component according to preferred embodiments of the present invention is not limited to one using the piezoelectric resonant element as described above, but is also applicable to various monolithic ceramic electrical components such as a monolithic capacitor or a monolithic thermister, or to various composite components such as LC components including a condenser and an inductor assembled together. In other words, the present invention may be applied to any appropriate electronic components having on its outer surface an external electrode to be used when being mounted onto the printed circuit board.

In the chip electronic component according to the first preferred embodiment of the present invention, a plurality of external electrodes extending over the side surfaces to the lower surface of the electronic component element are provided with the external electrode portion on the lower surface of the electronic component element having wide portions, so that an excess of solder remains on the wide portion and its tendency to flow to the narrow portions when being mounted to the printed circuit board by soldering is greatly reduced. Even when solder does flow to the narrow portion, it is only small amount of solder and therefore melted solder does not deposit on the side surface of the electronic component. Therefore, formation of solder fillets is reliably prevented.

Since solder fillets are not formed on the side surfaces, the mounting density is substantially increased. In addition, in case where solder fillets are present on the chip electronic component, stress caused by warpage of the printed circuit substrate when it is being mounted on the printed circuit substrate is created. However, since solder fillets are not formed on the chip electronic component according to the first preferred embodiment of the present invention, the bonded portion is not separated by this stress. Therefore, the bonding strength of the external electrode in the mounted state is substantially improved.

In addition, since the mounting density and the bonding strength are substantially improved by modifying the configuration of the external electrodes, or in other words, since the case substrate has such a simple construction, increased costs of producing the chip electronic component are prevented.

In the chip electronic component according to the first preferred invention, when the relationship $L_1<L_2<L_3$ is satisfied, the width of the external electrode portion on the side surface of the electronic component element is less than the width $L_2$ of the narrow portion. Therefore, even when a small amount of melted solder flows to the narrow portion, this melted solder does not reach the external electrode portion on the side surface, thereby formation of solder fillets is further reliably prevented.

In the chip electronic component according to the second preferred embodiment of the present invention, a plurality of external electrodes extending over the lower surface and the side surfaces of the electronic component element are provided such that each external electrode portion located on the lower surface of the electronic component element has a substantially uniform width from one shorter end to the other shorter end, and that the width $L_3$ of the external electrode portion on the lower surface is greater than the width $L_1$ of the external electrode portion located on the side surfaces of the electronic component. Therefore, melted solder remains on the external electrode portion located on the lower surface or the electronic component element when being mounted on the printed circuit board, as in the case of the chip electronic component according to the first preferred embodiment of the present invention. Consequently, formation of solder fillets is reliably prevented.

Therefore, the mounting density is substantially increased and bonding stability in the state of being mounted is achieved as in the case of the chip electronic component according to the first preferred embodiment. In addition, since the mounting density and the bonding strength are achieved only by modifying the configuration of the external electrode, the cost of the electronic component is not increased.

The chip electronic components according to the first and second preferred embodiments of the present invention may be applied to the chip electronic components using various types of electronic component elements, and when a piezoelectric resonant element is used as an electronic component element, the high-density mounting is achieved and a chip piezoelectric resonant component having a satisfactory bonding strength is provided according to the present invention.

In this case, a chip piezoelectric resonant component in which high-density mounting and a reliable bonding are achieved by using the piezoelectric resonant component including a piezoelectric resonant element and a first case substrate bonded on at least one surface of the piezoelectric resonant element so as not to interfere with the vibration of the piezoelectric resonant element, and by forming an external electrode on the first case substrate according to the present invention.

When the second case substrate is laminated so as not to interfere with the vibration of the piezoelectric resonant element on the upper surface of the piezoelectric resonant element, a chip piezoelectric resonant component of laminated type is provided.

When a cap member is mounted on the upper surface of the first case substrate in such a manner that it surrounds the piezoelectric resonant element, a chip electronic component with a cap in which the mounting density and the bonding stability is substantially improved is provided according to various preferred embodiments of the present invention.

In the mounting structure of the chip electronic component according to preferred embodiments of the present invention, the chip electronic component according to preferred embodiments of the present invention is mounted on the printed circuit board. In this case, the portion bonded by a conductive bond is located within the outer periphery of the chip electronic component as seen from the top of the chip electronic component, thereby significantly increasing the mounting density.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A chip electronic component comprising:
    a body of the chip electronic component having outer peripheral surfaces including an upper surface, a lower surface and a pair of side surfaces;
    an electronic component element having electrodes and defining part of said body of the chip electronic component; and
    a plurality of external electrodes arranged to extend over at least the lower surface and at least one of the side surfaces of said body of the chip electronic component and electrically connected to the electrodes of the electronic component element; wherein
        each portion of said external electrodes provided on the lower surface of said body of the chip electronic component is provided with a narrow portion and a wide portion; and
        the relationship L1<L2<L3 is satisfied, where L1 is the width of the external electrode portion located on said at least one of the side surfaces of said electric component element, L2 is the width of said narrow portion, and L3 is the width of said wide portion.

2. The chip electronic component according to claim 1, wherein said wide portion is substantially rectangular.

3. The chip electronic component according to claim 1, wherein said wide portion is substantially circular.

4. The chip electronic component according to claim 1, wherein the wide portion is substantially triangular.

5. The chip electronic component according to claim 1, wherein a second wide portion is provided on the lower portion of the electronic component element.

6. The chip electronic component according to claim 1, wherein said electronic component element includes a piezoelectric resonant element.

7. The chip electronic component according to claim 6, further comprising a first case substrate bonded to at least one side surface of said piezoelectric resonant element so as not to hinder the vibration of the piezoelectric resonant element.

8. The chip electronic component according to claim 7, further comprising a second case substrate disposed on the upper surface of said piezoelectric resonant element so as not to hinder the vibration of the piezoelectric resonant element.

9. The chip electronic component according to claim 6, wherein said electronic component element further comprises a first case member and a second case member surrounding said piezoelectric resonant element.

10. The chip electronic component according to claim 7, wherein a recess is provided in the first case substrate.

11. The chip electronic component according to claim 8, wherein a recess is provided in the second case substrate.

12. A mounting structure of a chip electronic component according to claim 1, wherein a bonding portion defined by a conductive bond does not extend outside of an outer periphery of the chip electronic component as seen from the top of the chip electronic component.

13. A chip electronic component comprising:
    a body of the chip electronic component having outer peripheral surfaces including an upper surface, a lower surface and a pair of side surfaces;
    an electronic component element having electrodes and defining part of said body of the chip electronic component; and a plurality of external electrodes arranged so as to extend over at least the lower surface and at least one of the side surfaces of said body of the chip electronic component and electrically connected to the electrodes of the electronic component element;

wherein each portion of said external electrodes provided on the lower surface of said body of the chip electronic component is arranged to have an almost uniform width from one longitudinal end to the other, and satisfy the relation L1<L3, where L3 is the width of each portion of the external electrodes provided on the lower surface of said body of the chip electronic component, and L1 is the width of each portion of the external electrodes provided on the at least one side surface of said body of the chip electronic component, each of the widths L1 and L3 being defined as a dimension of the external electrodes measured in a longitudinal direction of the body of the chip electronic component.

14. The chip electronic component according to claim 13, wherein said electronic component element includes a piezoelectric resonant element.

15. The chip electronic component according to claim 14, further comprising a first case substrate bonded to at least one side surface of said piezoelectric resonant element so as not to hinder the vibration of the piezoelectric resonant element.

16. The chip electronic component according to claim 15, further comprising the second case substrate laminated on the upper surface of said piezoelectric resonant element so as not to hinder the vibration of the piezoelectric resonant element.

17. The chip electronic component according to claim 14, wherein said electronic component element further comprises a first case member and a second case member surrounding said piezoelectric resonant element.

18. A mounting structure of a chip electronic component comprising a chip electronic component mounted on said printed circuit board via a conductive bond according to claim 13, wherein the bonded portion defined by the conductive bond is located inside of the outer periphery of the chip electronic component as seen from the top of the chip electronic component.

19. The chip electronic component according to claim 15, wherein a recess is provided in the first case substrate.

20. The chip electronic component according to claim 16, wherein a recess is provided in the second case substrate.

* * * * *